United States Patent
Tanaka

(10) Patent No.: US 7,756,664 B2
(45) Date of Patent: Jul. 13, 2010

(54) TEST APPARATUS AND MEASUREMENT CIRCUIT

(75) Inventor: Koichi Tanaka, Tokyo (JP)

(73) Assignee: Advantest Corporation (JP)

( * ) Notice: Subject to any disclaimer, the term of this patent is extended or adjusted under 35 U.S.C. 154(b) by 220 days.

(21) Appl. No.: 11/855,155

(22) Filed: Sep. 14, 2007

(65) Prior Publication Data

US 2008/0234961 A1    Sep. 25, 2008

Related U.S. Application Data

(60) Provisional application No. 60/895,985, filed on Mar. 21, 2007.

(51) Int. Cl.
*G01R 27/28* (2006.01)
(52) U.S. Cl. ...................................... 702/117
(58) Field of Classification Search ................. 702/117, 702/118, 120; 324/763, 764, 765
See application file for complete search history.

(56) References Cited

U.S. PATENT DOCUMENTS 6,775,637 B2 *  8/2004  Garcia ........................ 702/117

FOREIGN PATENT DOCUMENTS

| JP | 993116      | 4/1997 |
| JP | 2001-060854 | 3/2001 |
| JP | 2002156422  | 5/2002 |

* cited by examiner

*Primary Examiner*—Drew A Dunn
*Assistant Examiner*—Stephen J Cherry
(74) *Attorney, Agent, or Firm*—Chen Yoshimura LLP

(57) ABSTRACT

There is provided a test apparatus for testing a device under test. The test apparatus includes a gradient adjusting section that separately adjusts a gradient of a rising edge of a signal under measurement which is output from the device under test and a gradient of a falling edge of the signal under measurement, a sampling section that samples the signal under measurement whose edge gradients are adjusted by the gradient adjusting section, and a judging section that judges whether the device under test passes or fails the test based on a result of the sampling performed by the sampling section.

5 Claims, 6 Drawing Sheets

TEST APPARATUS AND MEASUREMENT CIRCUIT

CROSS REFERENCE TO RELATED APPLICATION

The present application claims priority from a U.S. Provisional Application(s) No. 60/895,985 filed on Mar. 21, 2007, the contents of which are incorporated herein by reference.

BACKGROUND

1. Technical Field

The present invention relates to a test apparatus and a measurement circuit. More particularly, the present invention relates to a test apparatus for testing a device under test and to a measurement circuit for measuring a signal under measurement.

2. Related Art

A known test apparatus for testing a device under test measures a signal under measurement which is output from the device under test, and judges whether the device under test passes or fails a test based on the result of the measurement. For example, a known apparatus measures the logic pattern of the signal under measurement and judges whether the measured logic pattern matches an expected value pattern, to judge whether the device under test passes or fails the test.

The logic pattern of the signal under measurement can be detected by sampling the signal under measurement with the use of a sampling clock which is in synchronization with the bit rate of the signal under measurement. Therefore, it is preferable that the timings of the edge positions and bit boundaries of the signal under measurement are accurately controlled.

Nevertheless, the timings of the edge positions and bit boundaries of the signal under measurement are displaced from corresponding ideal timings depending on the rising time Tr and the falling time Tf of the signal under measurement. When the signal under measurement is a differential signal, the crossing point of the differential signal is displaced from a corresponding ideal crossing point depending on such factors as the skew between the positive signal and the negative signal.

A known technique to compensate such displacement of the crossing point is disclosed in, for example, Unexamined Japanese Patent Application Publication No. 2001-60854. According to this technique, the timing of the crossing point is adjusted by shifting the static voltage level of one of the positive and negative signals.

FIG. 6 illustrates a differential signal. As described above, the timing of the crossing point of an actually output waveform is displaced from the timing of the crossing point of an ideal waveform. To remove the displacement, one of the positive and negative signals is shifted in the direction along the voltage axis. In this way, the timing of the crossing point can be compensated as indicated by the shifted waveform shown in FIG. 6.

However, when one of the positive and negative signals is shifted in the direction along the voltage axis, the difference in level between the positive and negative signals increases in correspondence with the amount by which one of the positive and negative signals is shifted. Therefore, the timing of the crossing point may not be sufficiently compensated, for example, when the circuit which receives the differential signal can only withstand a low voltage.

SUMMARY

Therefore, it is an object of an aspect of the present invention to provide a test apparatus and a measurement circuit which are capable of overcoming the above drawbacks accompanying the related art. The above and other objects can be achieved by combinations described in the independent claims. The dependent claims define further advantageous and exemplary combinations of the present invention.

According to an aspect related to the innovations herein, one exemplary test apparatus may include a test apparatus for testing a device under test. The test apparatus includes a gradient adjusting section that separately adjusts a gradient of a rising edge of a signal under measurement which is output from the device under test and a gradient of a falling edge of the signal under measurement, a sampling section that samples the signal under measurement whose edge gradients are adjusted by the gradient adjusting section, and a judging section that judges whether the device under test passes or fails the test based on a result of the sampling performed by the sampling section.

According to another aspect related to the innovations herein, one exemplary measurement circuit may include a measurement circuit for measuring a signal under measurement input thereto. The measurement circuit includes a gradient adjusting section that separately adjusts a gradient of a rising edge of the signal under measurement and a gradient of a falling edge of the signal under measurement, and a sampling section that samples the signal under measurement whose edge gradients are adjusted by the gradient adjusting section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, one aspect of the present invention will be described through some embodiments. The embodiments do not limit the invention according to the claims, and all the combinations of the features described in the embodiments are not necessarily essential to means provided by aspects of the invention.

Figure 1:
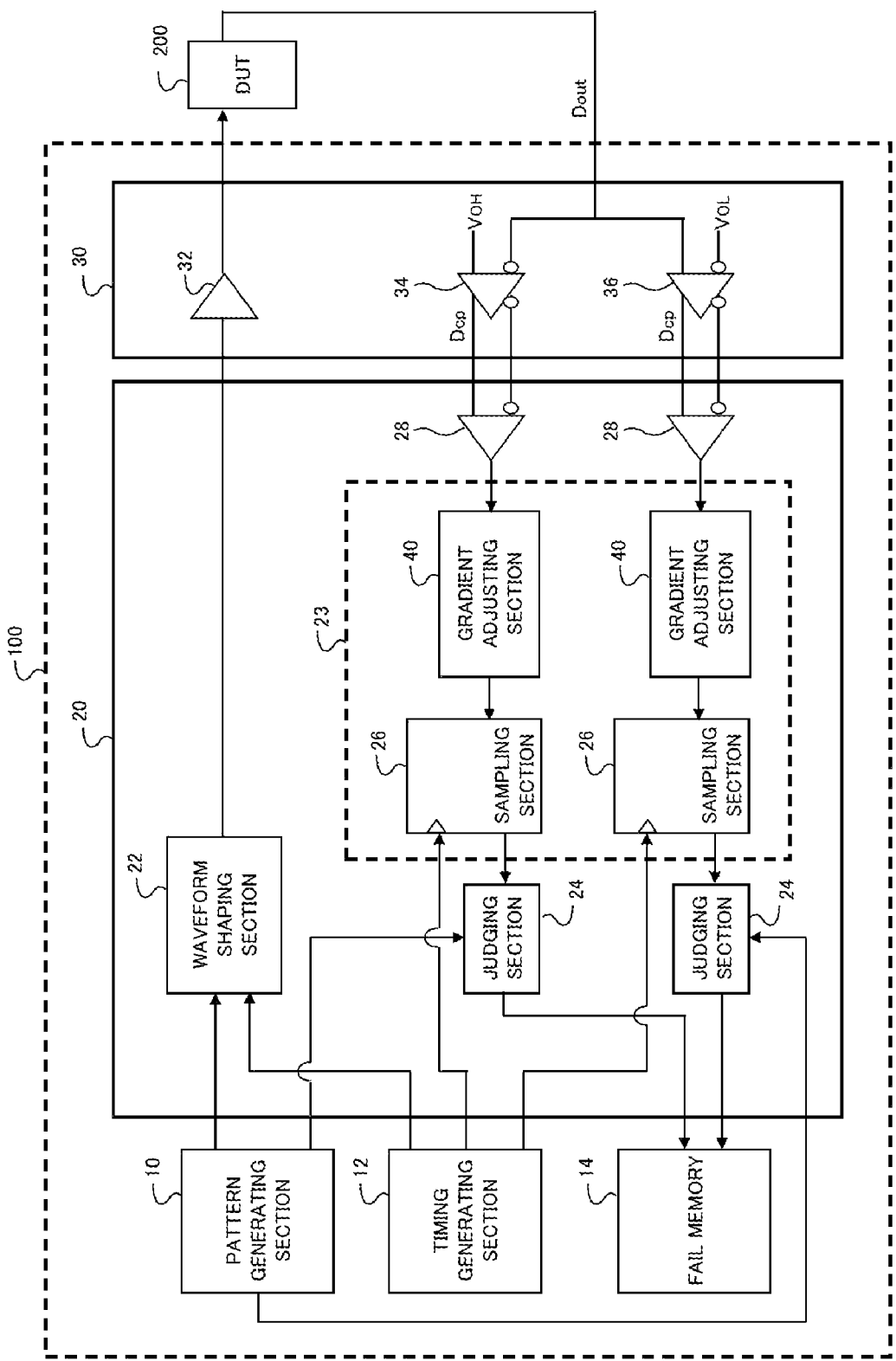
FIG. 1 illustrates an exemplary configuration of a test apparatus 100 relating to an embodiment of the present invention.

FIG. 1 illustrates an exemplary configuration of a test apparatus 100 relating to an embodiment of the present invention. The test apparatus 100 tests a device under test 200 such as a semiconductor circuit. The test apparatus 100 includes therein a pattern generating section 10, a timing generating section 12, a fail memory 14, a processing circuit 20, and a driver/comparator section 30.

The pattern generating section 10 generates a test pattern for testing the device under test 200. For example, the pattern generating section 10 generates a logic pattern which a test signal to be input into the device under test 200 is designed to have, and inputs the generated logic pattern into the processing circuit 20.

The timing generating section 12 generates a timing signal. For example, the timing generating section 12 generates a timing signal which indicates the period and edge timing of the test signal, and inputs the generated timing signal into the processing circuit 20.

The processing circuit 20 includes therein a waveform shaping section 22, a differential buffer 28, a measurement circuit 23, and a judging section 24. The waveform shaping section 22 generates a test signal in accordance with the test pattern received from the pattern generating section 10 and the timing signal received from the timing generating section 12, and inputs the generated test signal into the driver/comparator section 30.

The driver/comparator section 30 includes therein a driver 32, an H-side comparator 34, and an L-side comparator 36. The driver 32 adjusts the amplitude of the test signal received from the waveform shaping section 22, and inputs the adjusted test signal into the device under test 200.

The H-side comparator 34 and L-side comparator 36 receive a signal under measurement Dout which is output from the device under test 200 in response to the test signal. The H-side comparator 34 compares the signal level of the signal under measurement Dout with an H-side reference level VOH, and outputs a comparison result signal Dcp as a new signal under measurement. The H-side comparator 34 relating to the present example outputs, as the comparison result signal Dcp, a binary signal which indicates an H logic when the signal level of the signal under measurement Dout is higher than the H-side reference level VOH and indicates an L logic when the signal level of the signal under measurement Dout is equal to or lower than the H-side reference level VOH.

The L-side comparator 36 compares the signal level of the signal under measurement Dout with an L-side reference level VOL, and outputs a comparison result signal Dcp. According to the present example, the comparison result signals Dcp output from the H-side comparator 34 and L-side comparator 36 are differential signals.

The differential buffer 28 converts the comparison result signal Dcp which is input thereto from the driver/comparator section 30 and is thus a differential signal, into a comparison result signal Dcp which is a single-ended signal. Note that the configuration of the processing circuit 20 illustrated in FIG. 1 does not show a differential buffer 28 and some other constituents corresponding to the H-side comparator 34. However, the processing circuit 20 may further include a differential buffer 28, a measurement circuit 23, and a judging section 24 which all correspond to the H-side comparator 34. When the L-side comparator 36 is a comparator which outputs a single-ended signal, the processing circuit 20 may include therein a buffer which is not a differential buffer in place of the differential buffer 28.

The measurement circuit 23 measures the timing (for example, the edge timing) of the signal under measurement output from the differential buffer 28. The measurement circuit 23 includes therein a gradient adjusting section 40 and a sampling section 26. The gradient adjusting section 40 is positioned between the differential buffer 28 and the sampling section 26. It should be noted here that, when a pulse signal passes through a circuit element, the pulse width of the pulse signal may be different, by a slight amount though, between before and after the pulse signal passes through the circuit element. This difference in pulse width is mainly attributed to the difference in characteristics between the p-channel and n-channel transistors included in the circuit element, the difference in characteristics between the sink and source currents in the circuit element, the internal circuit structure, the difference in manufacturing process and the like.

The gradient adjusting section 40 separately adjusts, by a slight amount, the timing of the leading edge of the pulse signal which has passed through the circuit element and the timing of the trailing edge of the pulse signal which has passed through the circuit element. The gradient adjusting section 40 relating to the present example receives the signal under measurement output from the differential buffer 28 (the comparison result signal Dcp), and separately adjusts the gradient of the rising edge of the received signal under measurement and the gradient of the falling edge of the received signal under measurement. In this way, the gradient adjusting section 40 inputs the output signal whose leading and trailing edge timings are separately adjusted by a slight amount into the sampling section 26.

Generally speaking, the edge timing of a signal is determined by a timing at which the signal level of the signal reaches the threshold level of a circuit of a following stage. Therefore, the edge timing can be adjusted by adjusting the gradient of the edge. For example, the edge timing can be adjusted so as to be delayed by adjusting the gradient of the edge in such a manner that the absolute value of the gradient becomes smaller (in other words, the gradient is adjusted so that the edge becomes more acute). The configuration of the gradient adjusting section 40 is later described with reference to FIG. 2.

The sampling section 26 samples the signal under measurement whose leading and trailing edge timings are corrected by the gradient adjusting section 40 based on the adjustment of the gradients of the edges. The sampling section 26 may be a flip-flop which receives the signal under measurement at a data input terminal thereof and receives the timing signal at a clock input terminal thereof. The timing generating section 12 relating to the present example generates the timing signal which causes the sampling section 26 to sample the signal under measurement at the timing at which the device under test 200 should be judged whether to pass or fail a test.

The judging section 24 judges whether the device under test 200 passes or fails a test based on the result of the sampling performed by the sampling section 26. The judging section 24 relating to the present example compares the logic pattern of the signal under measurement with an expected value pattern supplied thereto, to judge the timing of the signal under measurement at a predetermined timing. In this way, the judging section 24 relating to the present example judges whether the device under test 200 passes or fails the test. The pattern generating section 10 relating to the present example generates the expected value pattern in accordance with the test pattern.

The fail memory 14 stores thereon the result of the judgment made by the judging section 24. The fail memory 14 relating to the present example stores, on a predetermined memory region, the result of the judgment which is made by the judging section 24 in association with each address of the device under test 200.

With the above-described configuration, the test apparatus 100 tests the device under test 200. As described above, the gradient adjusting section 40 of the test apparatus 100 adjusts the timings of the leading and trailing edges. Therefore, the test apparatus 100 can accurately judge the timing of the signal under measurement, in units of, for example, as fine as approximately several dozen picoseconds. The test apparatus 100 separately adjusts the gradient of the rising edge and the gradient of the falling edge. Having this feature, the test apparatus 100 can adjust the rising and falling edge timings respectively to ideal timings, even when the rising and falling edge timings are displaced from corresponding ideal timings by different amounts.

In preparation for the use, the test apparatus 100 may calibrate in advance the gradient adjusting section 40. For example, the test apparatus 100 causes a reference clock having a predetermined duty ratio (for example, 50%) to be applied from the output end of the device under test 200 to the processing circuit 20. The processing circuit 20 searches for the positions of the leading and trailing edges of the reference clock by using a known timing signal (a strobe signal) supplied thereto from the timing generating section 12.

Subsequently, the processing circuit 20 adjusts the adjusting amounts of the gradient adjusting section 40 for the gradients of the leading and trailing edges so that the duty ratio of the reference clock which is measured by the processing circuit 20 takes a predetermined value (for example, 50%). The above-described procedure can correct the timing errors of the leading and trailing edges which may occur due to the transmission path from the device under test 200 to the processing circuit 20. Furthermore, the above-described procedure can also correct the measurement errors of the leading and trailing edge timings which may be caused by the setup and hold characteristics of the measuring section 26.

When the threshold value of the L-side comparator 36, that is to say, the L-side reference level VOL is changed, the edge timing of the signal output from the L-side comparator 36 may change. In view of this, the test apparatus 100 may calibrate the gradient adjusting section 40 each time the L-side reference level VOL of the L-side comparator 36 is set.

The driver/comparator section 30 and the processing circuit 20 may be respectively formed in different LSIs. Which is to say, the differential buffer 28, gradient adjusting section 40, and sampling section 26 are formed in the same LSI, and the driver/comparator section 30 may be formed outside the LSI.

If this is the case, the differential buffer 28 receives the signal under measurement from the L-side comparator 36 that is formed outside the LSI. Accordingly, the timings of the leading and trailing edges of the signal under measurement are displaced remarkably because of various factors including the skew between the positive and negative signals, more blunt rising and falling edges and the difference in amplitude level. To address this issue, the gradient adjusting section 40 is provided between the differential buffer 28 and the sampling section 26. In this way, the displacement of the edge timings of the signal under measurement Dout which is observed in the processing circuit 20 is compensated so that the signal under measurement Dout in the processing circuit 20 has substantially the same state as the signal under measurement Dout which is originally output from the device under test 200. As a result, the test apparatus 100 can accurately measure the signal under measurement Dout. Here, the length of the transmission path from the differential buffer 28 to the sampling section 26 is preferably shorter than the length of the transmission path from the driver/comparator section 30 to the differential buffer 28.

Figure 2:
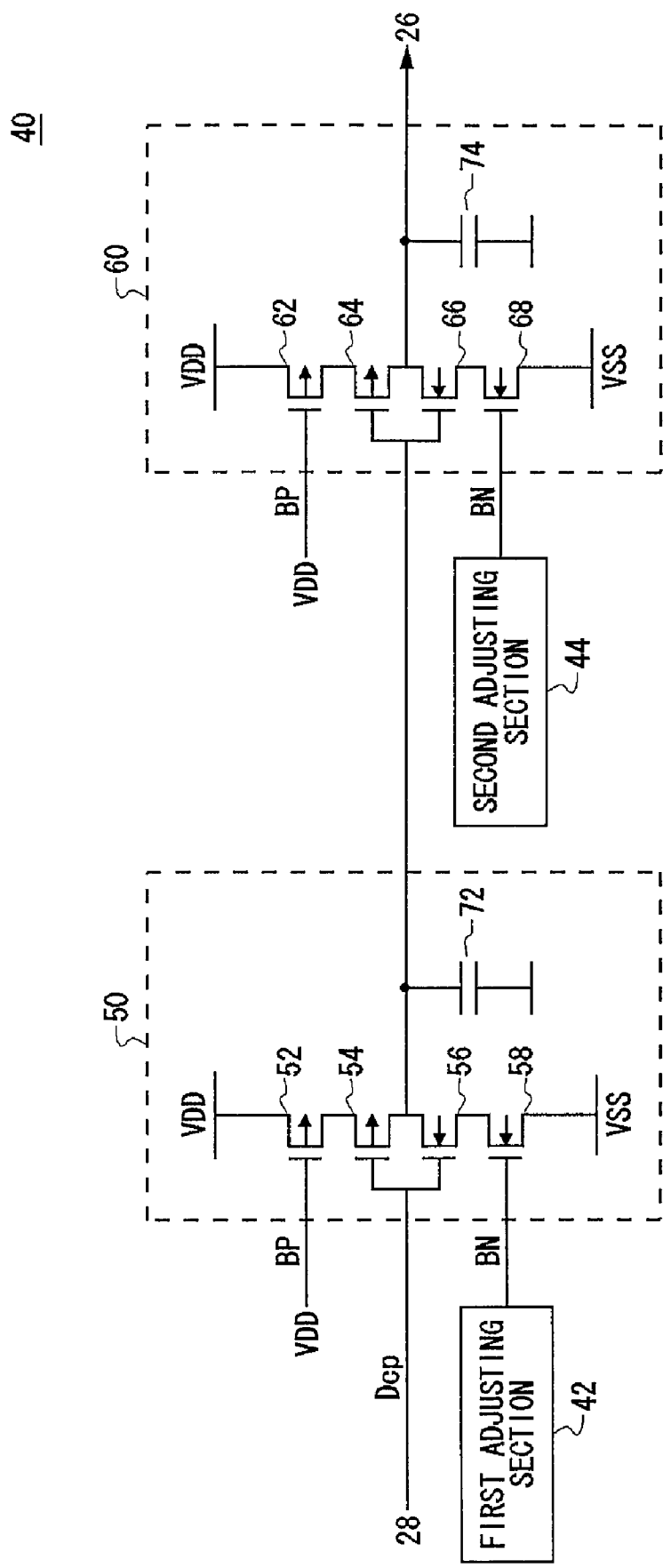
FIG. 2 illustrates an exemplary configuration of a gradient adjusting section 40.

FIG. 2 illustrates an exemplary configuration of the gradient adjusting section 40. The gradient adjusting section 40 includes therein a first adjusting section 42, a second adjusting section 44, a first inverter 50 and a second inverter 60. The first inverter 50 inverts the signal under measurement input thereto from the differential buffer 28, and outputs the inverted signal under measurement. The first inverter 50 inputs, into the second inverter 60, a waveform having the slew rate which is obtained by integrating the inverted signal under measurement with the output impedance of the first inverter 50 and a capacitance 72. In other words, the first inverter 50 inputs, into the second inverter 60, the waveform having the gradient which is obtained based on the integral time constant between (i) a sink-side transistor 56 whose current is limited by a current sink 58 of the first inverter 50 and (ii) the capacitance 72. The first adjusting section 42 adjusts the gradient of one of the rising and falling edges of the signal output from the first inverter 50. The first adjusting section 42 relating to the present example generates a variable DC voltage which adjusts the gradient of the falling edge of the signal output from the first inverter 50. The first adjusting section 42 may be a DA converter with a 6-bit resolution, for example.

The second inverter 60 inverts the signal output from the first inverter 50 and outputs the inverted signal. The second inverter 60 inputs, into the sampling section 26, a waveform having the slew rate which is obtained by integrating the inverted signal with the output impedance of the second inverter 60 and a capacitance 74. The second adjusting section 44 adjusts the gradient of the same one of the rising and falling edges of the signal output from the second inverter 60, as the first adjusting section 42. The second adjusting section 44 relating to the present example adjusts the gradient of the falling edge of the signal output from the second inverter 60. Since the gradient adjusting section 40 has the above-described configuration, the timings of the rising and falling edges of the signal output from the gradient adjusting section 40 are separately adjusted.

The first inverter 50 includes therein a source-side transistor 54, the sink-side transistor 56, a current source 52, the current sink 58, and the capacitance 72. The current source 52 and current sink 58 may be an n-channel FET and a p-channel FET which respectively define the amount of source current and the amount of sink current in the first inverter 50.

The source-side transistor 54 is turned on when the signal under measurement input from the differential buffer 28 indicates the L logic, to charge the capacitance 72 with the source current defined by the current source 52. The sink-side transistor 56 is turned on when the signal under measurement indicates the H logic, to discharge the capacitance 72 with the sink current defined by the current sink 58. The voltage of the capacitance 72 is input into the second inverter 60.

The first adjusting section 42 adjusts the gate voltage of one of the current source 52 and the current sink 58 of the first inverter 50, in order to adjust the gradient of the edge of the signal output from the first inverter 50. According to the present example, the current sink 58 is an n-channel FET that is provided between the sink-side transistor 56 and the L-side power source line VSS, and the first adjusting section 42 adjusts the gate voltage of the current sink 58. Since the gradient of the falling edge of the signal output from the first inverter 50 is determined by the amount of the sink current which discharges the capacitance 72, the above-described configuration enables the first adjusting section 42 to adjust the gradient of the falling edge.

As a result of the above-described procedure, the gradient adjusting section 40 can adjust the timing of the rising edge of the signal under measurement Dcp. Here, the LSI is preferably designed in such a manner that the current sink 58 has higher driving capability. The second adjusting section 44 may be omitted when the controllable range of the current sink 58 is determined in such a manner that driving current of the sink-side transistor 56 can be varied within a range from approximately half the driving current of the source-side transistor 54 to approximately double the driving current of the source-side transistor 54.

The second inverter 60 includes therein a source-side transistor 64, a sink-side transistor 66, a current source 62, a current sink 68 and a capacitance 74. The second inverter 60 may have a similar configuration to the first inverter 50. The respective constituents of the second inverter 60 may have the same characteristics as the corresponding constituents of the first inverter 50.

The second adjusting section 44 adjusts the gate voltage of one of the current sources of the second inverter 60, in order to adjust the gradient of the edge of the signal output from the second inverter 60, where the first and second adjusting sections 42 and 44 adjust the gate voltage of the current source of the same channel. According to the present example, the current sink 68 is an n-channel FET that is provided between the sink-side transistor 66 and the L-side power source line VSS, and the second adjusting section 44 adjusts the gate voltage of the current sink 68.

The above-described configuration enables the second adjusting section 44 to adjust the gradient of the falling edge of the signal output from the second inverter 60. Here, the gradient of the rising edge of the signal output from the second inverter 60 has already been adjusted by the first inverter 50 and the first adjusting section 42. Therefore, the above-described configuration enables the gradient adjusting section 40 to separately adjust the gradients of the respective edges of the signal under measurement Dcp.

When the gradient adjusting section 40 is configured in the above-described manner, the pulse waveform which the sampling section 26 receives can have the same state as the waveform of the signal under measurement Dout that is output from the device under test 200 (have the same leading and trailing edge timings as the waveform of the signal under measurement Dout). Therefore, the judging section 24 can accurately judge the timing of the signal under measurement Dout. As a result, since the timing errors which are caused by the circuits on the transmission path such as the L-side comparator 36 and the differential buffer 28 can be corrected, a test apparatus having higher timing accuracy can be realized.

For example, it is assumed that the rising and falling edges are formed by using the n-channel and p-channel FETs as shown in FIG. 2. In this case, when the edge timings are adjusted by controlling both of the n-channel FET and the p-channel FET, the difference in characteristics between the n-channel and p-channel FETs causes adjustment errors to occur between the edge timings. According to the present example, however, the gradient adjusting section 40 adjusts the gradients of the edges by using the FETs of the same channel in the two cascaded inverters provided therein. This configuration can eliminate the adjustment errors which may be caused by the difference in characteristics between the n-channel FET and the p-channel FET. As a result, the test apparatus 100 relating to the present example can accurately adjust the edge timings of the signal.

Figure 3:
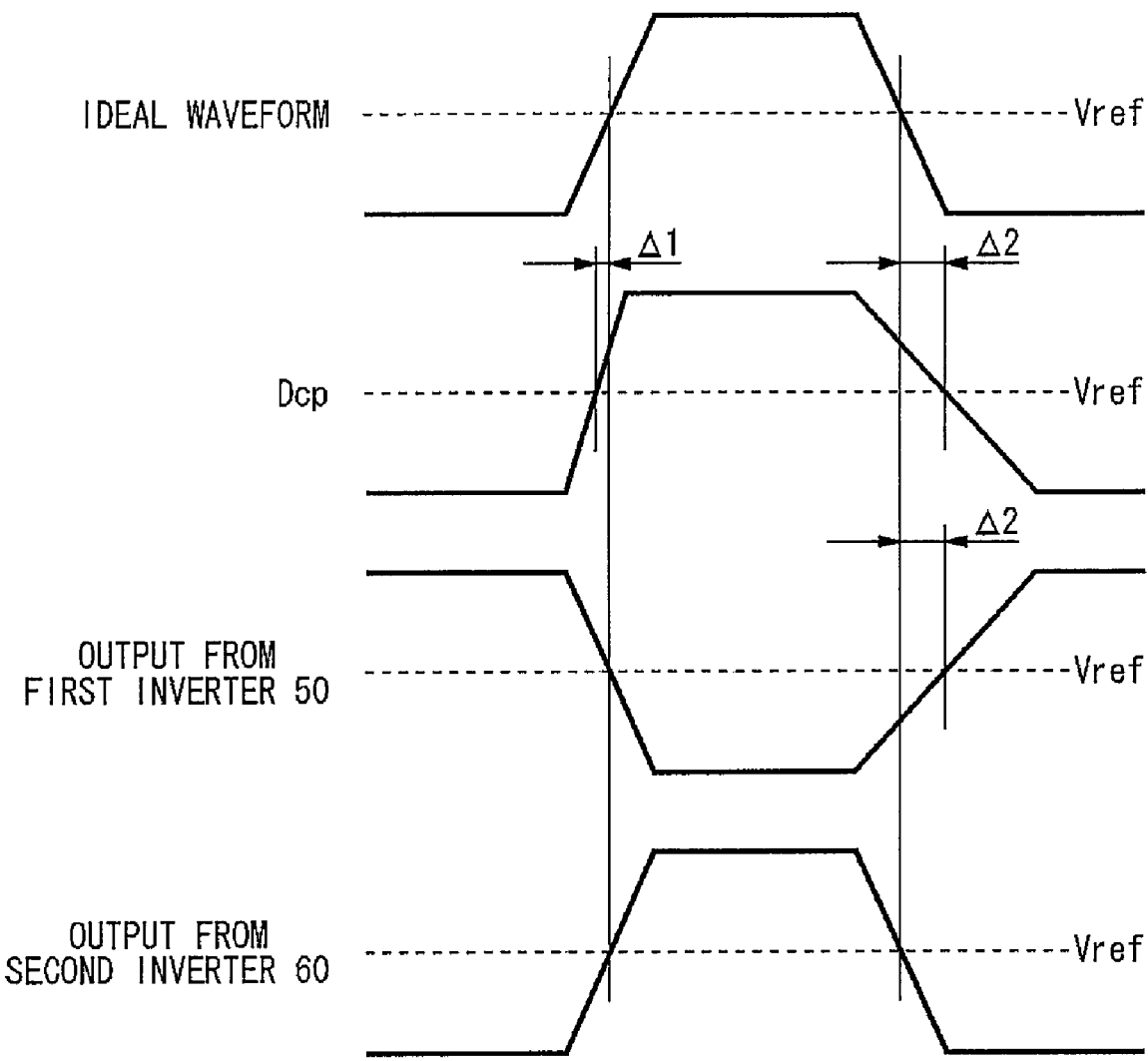
FIG. 3 illustrates an exemplary operation performed by the gradient adjusting section 40 illustrated in FIG. 2.

FIG. 3 illustrates an exemplary operation of the gradient adjusting section 40 illustrated in FIG. 2. As illustrated in FIG. 3, the edge timings of the signal under measurement Dcp input into the gradient adjusting section 40 have errors $\Delta 1$ and $\Delta 2$ with respect to the edge timings of the ideal waveform of the signal under measurement. Here, the edge timings may indicate the timings at which the edges of the waveform cross a predetermined DC level Vref. For example, the timing errors $\Delta 1$ and $\Delta 2$ may be caused by unevenness of the characteristics of the circuits on the transmission path such as the L-side comparator 36 and the differential buffer 28.

The first inverter 50 inverts the signal under measurement Dcp and outputs the inverted signal under measurement. The signal output from the first inverter 50 has a falling edge with an adjusted gradient. The second inverter 60 receives the signal output from the first inverter 50, inverts the received signal, and outputs the inverted signal. The signal output from the second inverter 60 has a falling edge with an adjusted gradient.

Since the gradient adjusting section 40 operates in the above-described manner, the respective edges of the signal output from the second inverter 60 have adjusted gradients as shown in FIG. 3. Therefore, the gradient adjusting section 40 can correct the edge timing errors $\Delta 1$ and $\Delta 2$, to compensate the signal under measurement Dcp so that the waveform of the signal under measurement Dcp has the same pulse width as the ideal waveform as illustrated in FIG. 3. Here, the test apparatus 100 may include therein a skew correcting circuit that adjusts the phase of the pulse of the signal under measurement Dcp in order to compensate the skew between the signal under measurement Dcp and another signal under measurement Dcp which is input into a different pin of the test apparatus 100. The skew correcting circuit may be a variable delay circuit, for example.

Figure 4:
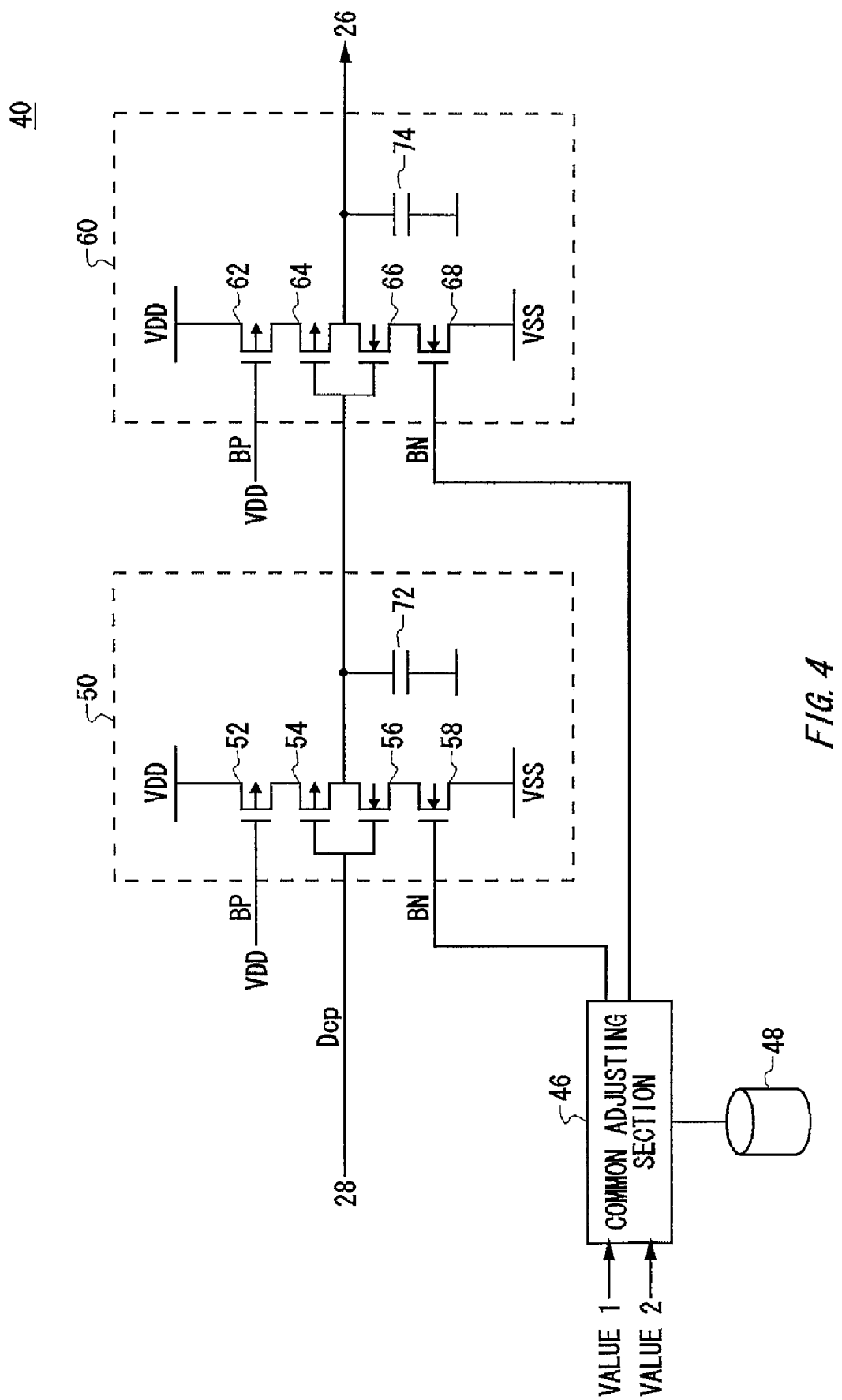
FIG. 4 illustrates another exemplary configuration of the gradient adjusting section 40.

FIG. 4 illustrates another exemplary configuration of the gradient adjusting section 40. The gradient adjusting section 40 relating to the present example includes therein the first inverter 50, the second inverter 60, a common adjusting section 46, and a table storing section 48.

The first and second inverters 50 and 60 may be the same as the first and second inverters 50 and 60 described with reference to FIGS. 1 to 3. The common adjusting section 46 controls the current sources of a single channel, that is to say, the current sources (52 and 62) of the p-channel of the first and second inverters 50 and 60, or the current sinks (58 and 68) of the n-channel of the first and second inverters 50 and 60.

The common adjusting section 46 relating to the present example separately adjusts the gate voltages applied to the current sources of the n-channel (the current sinks 58 and 68). The common adjusting section 46 receives, from a user or the like, a value 1 indicating the gradient which the edge to be adjusted by means of the first inverter 50 is designed to have and a value 2 indicating the gradient which the edge to be adjusted by means of the second inverter 60 is designed to have. The values 1 and 2 may indicate the gradients of the edges of the ideal waveform, for example.

The table storing section 48 stores thereon a table stipulating the relation between the gate voltages applied to the current sources of the inverters and the gradients of the edges adjusted by means of the inverters. The table may be obtained by measuring the gradients of the edges while sequentially varying the gate voltages output from the common adjusting section 46 and detecting the gradients of the edges in association with each level of the gate voltages.

According to the present example, the gradient adjusting section 40 adjusts the gate voltages of the FETs of the same channel in order to control the gradients of the edges adjusted by means of the respective inverters. Therefore, the table storing section 48 may store thereon a table stipulating the relation between the gate voltage and the current (the gradient of the edge) for the FET of the single channel. In addition, the common adjusting section 46 may refer to the same table for both of the values 1 and 2. Having the above-described configuration, the gradient adjusting section 40 can adjust the gradients of the edges accurately and easily.

The common adjusting section 46 may cause a predetermined test signal to be input into the device under test 200, and then measure how much the crossing timings of the rising and falling edges of the signal output from the gradient adjusting section 40 are displaced from the ideal crossing timings. Based on this, the common adjusting section 46 may generate the gate voltages in accordance with the measured amounts of the displacement.

Figure 5:
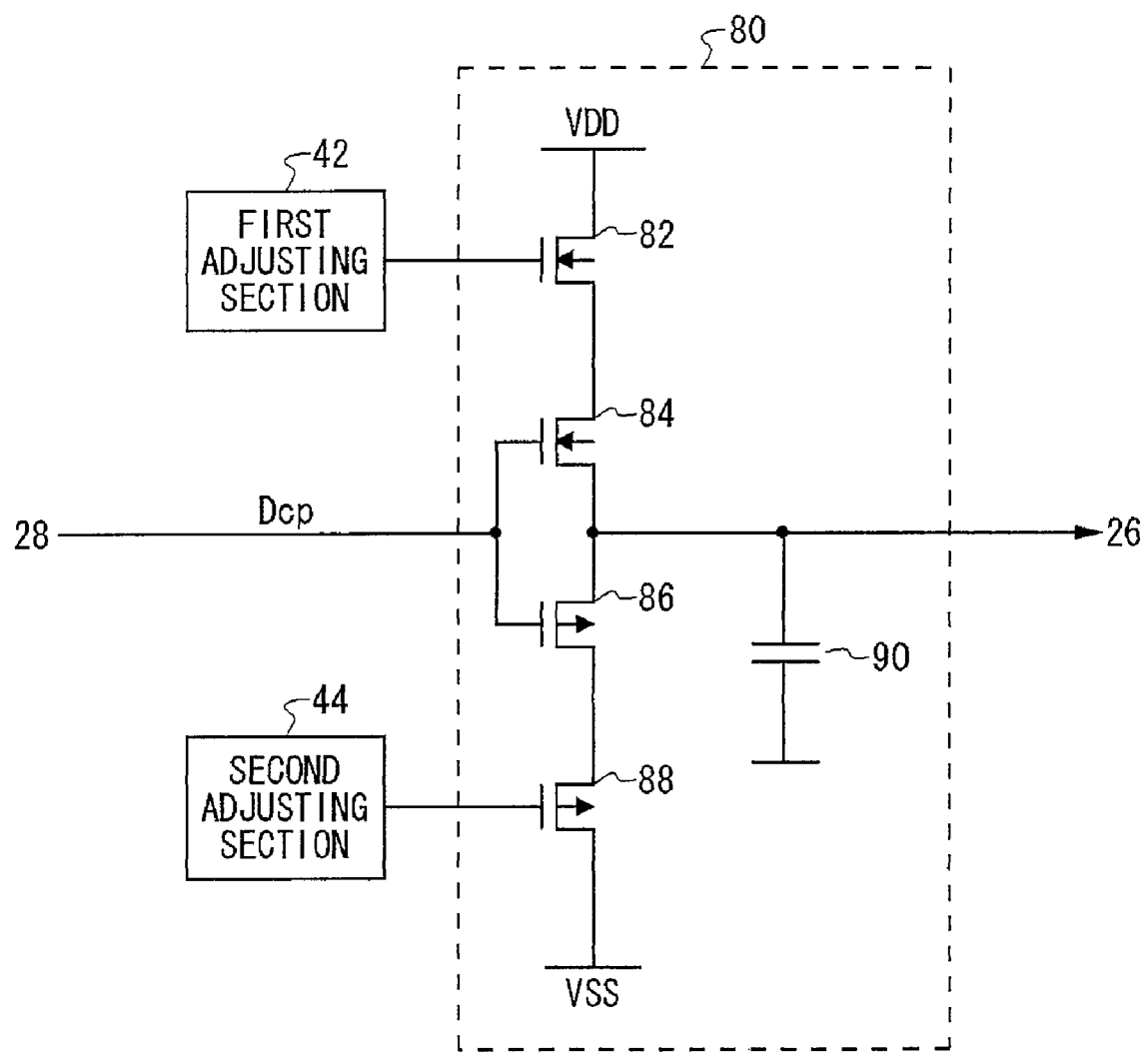
FIG. 5 illustrates another exemplary configuration of the gradient adjusting section 40.
Figure 6:
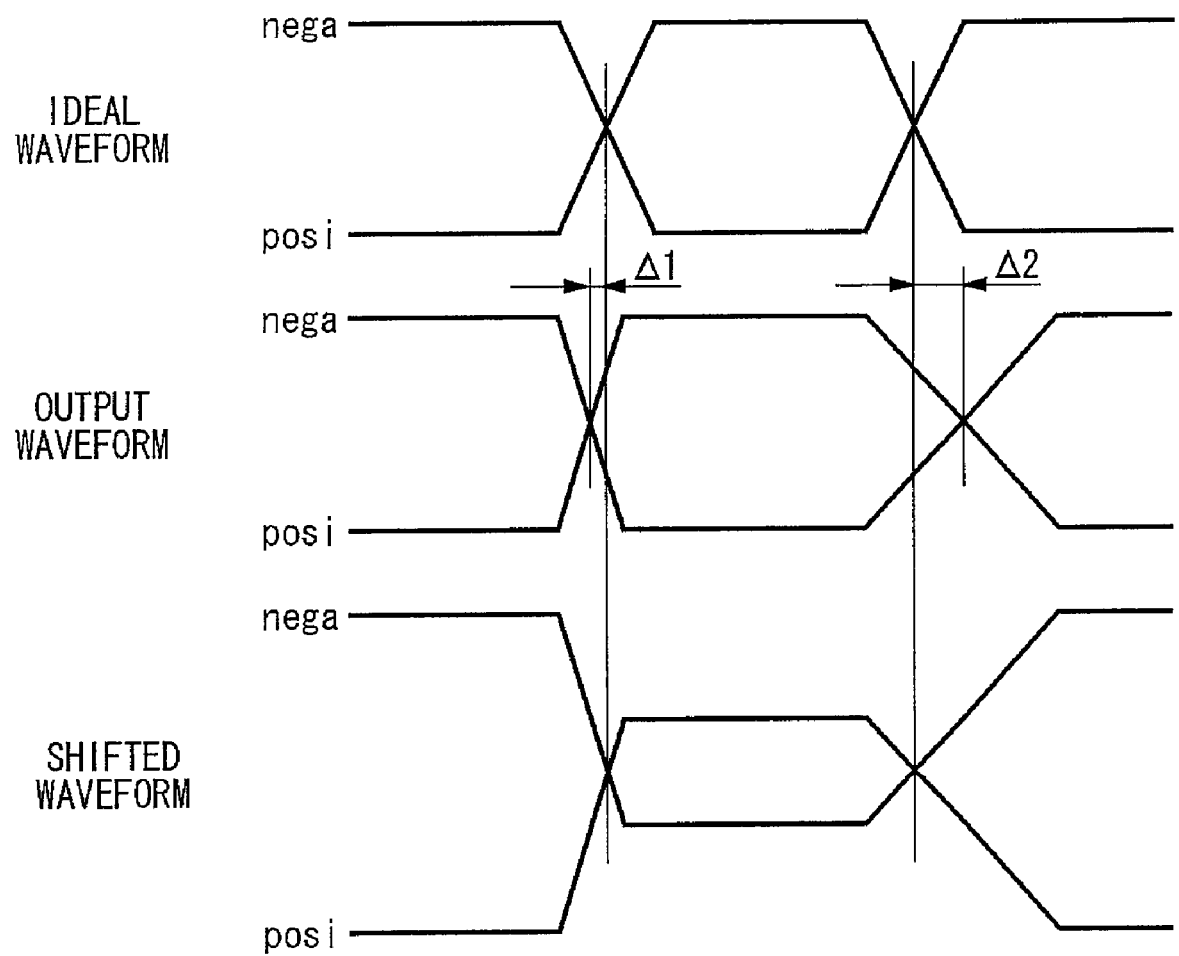
FIG. 6 illustrates a differential signal.

FIG. 5 illustrates another exemplary configuration of the gradient adjusting section 40. According to the present example, the gradient adjusting section 40 includes therein the first adjusting section 42, the second adjusting section 44 and a buffer 80. The buffer 80 receives the signal under measurement from the differential buffer 28, and outputs the signal under measurement without inversion. The buffer 80 includes therein a current source 82, a source-side transistor 84, a sink-side transistor 86, a current sink 88, and a capacitance 90.

The source-side transistor 84 is turned on when the signal under measurement indicates the H logic, to charge the capacitance 90 with the source current defined by the current source 82. The sink-side transistor 86 is turned on when the signal under measurement indicates the L logic, to discharge the capacitance 90 with the sink current defined by the current sink 88. The voltage of the capacitance 90 is input into the sampling section 26.

The first adjusting section 42 adjusts the gradient of one of the rising and falling edges of the signal output from the buffer 80. The second adjusting section 44 adjusts the gradient of a different one of the rising and falling edges of the signal output from the buffer 80.

According to the present example, the first adjusting section 42 adjusts the gradient of the rising edge of the signal output from the buffer 80 by adjusting the amount of the source current generated by the current source 82. The second adjusting section 44 adjusts the gradient of the falling edge of the signal output from the buffer 80 by adjusting the amount of the sink current generated by the current sink 88. With the above-described configuration, the gradient adjusting section 40 can also adjust the gradients of the respective edges of the signal to be input into the sampling section 26. As a result, the gradient adjusting section 40 relating to the present example can separately adjust the timings of the leading and trailing edges of the pulse.

While one aspect of the present invention has been described through some embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

Note that the n-channel FET mentioned in the above examples may be an n-channel MOSFET. Similarly, the p-channel FET may be a p-channel MOSFET. This pair of MOSFETs may be a pair of CMOSFETs.

As is apparent from the above description, an embodiment of the present invention can accurately adjust the edge timings of a signal under measurement. As a result, the embodiment of the present invention can accurately test a device under test.

What is claimed is:

1. A test apparatus for testing a device under test, comprising:
    a gradient adjusting section that separately adjusts a gradient of a rising edge of a signal under measurement which is output from the device under test and a gradient of a falling edge of the signal under measurement;
    a sampling section that samples the signal under measurement whose edge gradients are adjusted by the gradient adjusting section;
    a judging section that judges whether the device under test passes or fails the test based on a result of the sampling performed by the sampling section; and
    a comparator that compares a level of a signal output from the device under test with a reference level to generate a comparison result signal, and outputs the comparison result signal as the signal under measurement,
    wherein the gradient adjusting section is positioned between the comparator and the sampling section, and adjusts the gradients of the edges of the signal under measurement which is output from the comparator and inputs the adjusted signal under measurement into the sampling section,
    the comparator outputs, as the signal under measurement, the comparison result signal which is a differential signal,
    the test apparatus further comprises a differential buffer that converts the signal under measurement which is output from the comparator and is a differential signal into a single-ended signal under measurement, and
    the gradient adjusting section adjusts the gradients of the edges of the signal under measurement which is output from the differential buffer, and inputs the adjusted signal under measurement into the sampling section.

2. The test apparatus as set forth in claim 1, wherein the differential buffer, the gradient adjusting section and the sampling section are formed in a same LSI, and the comparator is formed outside the LSI.

3. The test apparatus as set forth in claim 2, wherein a length of a transmission path from the differential buffer to the sampling section is shorter than a length of a transmission path from the comparator to the differential buffer.

4. A test apparatus for testing a device under test, comprising:
    a gradient adjusting section that separately adjusts a gradient of a rising edge of a signal under measurement which is output from the device under test and a gradient of a falling edge of the signal under measurement;
    a sampling section that samples the signal under measurement whose edge gradients are adjusted by the gradient adjusting section; and
    a judging section that judges whether the device under test passes or fails the test based on a result of the sampling performed by the sampling section,
    wherein the gradient adjusting section includes:
        a first inverter that inverts the signal under measurement and outputs the inverted signal under measurement;
        a first adjusting section that adjusts a gradient of one of a rising edge and a falling edge of a signal output from the first inverter;
        a second inverter that inverts a signal output from the first inverter and inputs the inverted signal into the sampling section; and a second adjusting section that adjusts a gradient of the same one of a rising edge and a falling edge of a signal output from the second inverter, as the first adjusting section, the first inverter includes therein an n-channel FET and a p-channel FET that define an amount of a source current and an amount of a sink current, the second inverter includes therein an n-channel FET and a p-channel FET that define an amount of a source current and an amount of a sink current, the first adjusting section adjusts the gradient of one of the edges of the signal output from the first inverter, by adjusting one of a gate voltage of the n-channel FET of the first inverter and a gate voltage of the p-channel FET of the first inverter, and the second adjusting section adjusts the gradient of one of the edges of the signal output from the second inverter, by adjusting the same one of a gate voltage of the n-channel FET of the second inverter and a gate voltage of the p-channel FET of the second inverter, as the first adjusting section.

5. A measurement circuit for measuring a signal under measurement input thereto, comprising:

a gradient adjusting section that separately adjusts a gradient of a rising edge of the signal under measurement and a gradient of a falling edge of the signal under measurement; and a sampling section that samples the signal under measurement whose edge gradients are adjusted by the gradient adjusting section, wherein the gradient adjusting section includes:

a first inverter that inverts the signal under measurement and outputs the inverted signal under measurement;

a first adjusting section that adjusts a gradient of one of a rising edge and a falling edge of a signal output from the first inverter;

a second inverter that inverts a signal output from the first inverter and inputs the inverted signal into the sampling section; and a second adjusting section that adjusts a gradient of the same one of a rising edge and a falling edge of a signal output from the second inverter, as the first adjusting section, the first inverter includes therein an n-channel FET and a p-channel FET that define an amount of a source current and an amount of a sink current, the second inverter includes therein an n-channel FET and a p-channel FET that define an amount of a source current and an amount of a sink current, the first adjusting section adjusts the gradient of one of the edges of the signal output from the first inverter, by adjusting one of a gate voltage of the n-channel FET of the first inverter and a gate voltage of the p-channel FET of the first inverter, and the second adjusting section adjusts the gradient of one of the edges of the signal output from the second inverter, by adjusting the same one of a gate voltage of the n-channel FET of the second inverter and a gate voltage of the p-channel FET of the second inverter, as the first adjusting section.

* * * * *